(12) United States Patent
Zeng et al.

(10) Patent No.: US 9,966,415 B2
(45) Date of Patent: May 8, 2018

(54) COMPLEMENTARY THIN FILM TRANSISTOR AND MANUFACTURING METHOD THEREOF

(71) Applicant: SHENZHEN CHINA STAR OPTOELECTRONICS TECHNOLOGY CO., LTD., Guangdong (CN)

(72) Inventors: Mian Zeng, Guangdong (CN); Hsiangchih Hsiao, Guangdong (CN); Shengdong Zhang, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 237 days.

(21) Appl. No.: 15/034,355

(22) PCT Filed: Apr. 8, 2016

(86) PCT No.: PCT/CN2016/078751
§ 371 (c)(1),
(2) Date: May 4, 2016

(87) PCT Pub. No.: WO2017/147969
PCT Pub. Date: Sep. 8, 2017

(65) Prior Publication Data
US 2018/0097035 A1     Apr. 5, 2018

(30) Foreign Application Priority Data
Feb. 29, 2016    (CN) .......................... 2016 1 0113713

(51) Int. Cl.
*H01L 27/14*    (2006.01)
*H01L 27/28*    (2006.01)
*H01L 51/05*    (2006.01)
*H01L 21/8256*    (2006.01)
*H01L 51/00*    (2006.01)

(52) U.S. Cl.
CPC ........ *H01L 27/283* (2013.01); *H01L 21/8256* (2013.01); *H01L 51/0021* (2013.01); *H01L 51/0541* (2013.01); *H01L 51/0558* (2013.01)

(58) Field of Classification Search
CPC ............... H01L 27/283; H01L 21/8256; H01L 51/0021; H01L 51/0541; H01L 51/0558
USPC ............................................. 257/40, 59, 72
See application file for complete search history.

(56) References Cited

U.S. PATENT DOCUMENTS 7,306,981 B2 * 12/2007 Kuwabara ........... H01L 27/1214
257/E21.412

* cited by examiner

*Primary Examiner* — Tan N Tran
(74) *Attorney, Agent, or Firm* — WPAT, PC

(57) ABSTRACT

A complementary thin film transistor and manufacturing method thereof are provided. The complementary thin film transistor has a substrate, an n-type semiconductor layer, a p-type semiconductor layer, a first passivation layer, a first electrode metal layer, and a second electrode metal layer. The n-type semiconductor layer is disposed above the substrate, and comprises a metal oxide material. The p-type semiconductor layer is disposed above the substrate, and comprises an organic semiconductor material. The first passivation layer is disposed between the n-type semiconductor layer and the p-type semiconductor layer, and formed with at least one contacting hole. The first electrode metal layer and the second electrode metal layer are electrically connected with each other through the contacting hole.

19 Claims, 5 Drawing Sheets

COMPLEMENTARY THIN FILM TRANSISTOR AND MANUFACTURING METHOD THEREOF

FIELD OF THE INVENTION

The present invention relates to a thin film transistor and a manufacturing method thereof, and more particularly to a complementary thin film transistor and manufacturing method thereof.

BACKGROUND OF THE INVENTION

Complementary Metal-Oxide-Semiconductor (CMOS) is a design of an integrated circuit process which can make components of n-type MOSFET (NMOS) and p-type MOSFET (PMOS) from a silicon wafer template. CMOS means that physical characteristics of NMOS and PMOS are complementarity. SRAM, microcontrollers, microprocessors, CMOS image sensing devices, or other digital logic circuitry can be made from a CMOS process. CMOS is formed from NMOS and PMOS, and CMOS is a basic circuit construction of an integrated circuit. A CMOS transmission gate is formed by connecting a p-type channel MOSFET and an n-type channel MOSFET in parallel, which can be a switch for transmitting analog signals or a basic unit of logic circuits.

A substrate of a display panel is a glass or plastic substrate. Refer to FIG. 1, which is a schematic circuit diagram of a transmission gate of a Continuous Time Fourier Transform (CTFT transmission gate). The CTFT transmission gate connected to pulse trigger signal terminals CP, CN, and has a p-type thin film transistor 11, and an n-type thin film transistor 12, wherein the p-type thin film transistor 11 connects to the n-type thin film transistor 12 in parallel.

However, in the technology of low temperature polysilicon (LTPS), the p-type thin film transistor 11 and the n-type thin film transistor 12 are formed by different types of doping from the channel. The preparation process of CTFT circuit has a complex process with a high manufacturing cost.

SUMMARY OF THE INVENTION

An object of the present invention is to provide a complementary thin film transistor, wherein an n-type thin film transistor is formed with a metal oxide material and a p-type thin film transistor is formed with a organic semiconductor material for improving the device characteristics.

Another object of the present invention is to provide a manufacturing method of a complementary thin film transistor, wherein an n-type thin film transistor is formed with a metal oxide material and a p-type thin film transistor is formed with an organic semiconductor material to simplify the process and reduce the manufacturing cost.

To achieve the above object, the present invention provides a complementary thin film transistor, the complementary thin film transistor comprises a substrate, an n-type semiconductor layer, a p-type semiconductor layer, a first passivation layer, a first electrode metal layer, and a second electrode metal layer. The n-type semiconductor layer is disposed above the substrate, wherein the n-type semiconductor layer comprises a metal oxide material. The p-type semiconductor layer is disposed above the substrate, wherein the p-type semiconductor layer comprises an organic semiconductor material. The first passivation layer is disposed between the n-type semiconductor layer and the p-type semiconductor layer, and formed with at least one contacting hole. The first electrode metal layer is formed on the n-type semiconductor layer. The second electrode metal layer is formed on the first passivation layer, wherein the first electrode metal layer and the second electrode metal layer are electrically connected with each other through the contacting hole.

In one embodiment of the present invention, the complementary thin film transistor further includes a first gate layer and an insulation layer, the first gate layer is formed on the substrate, and the insulation layer is formed on the first gate layer and the substrate, wherein the n-type semiconductor layer is formed on the insulation layer.

In one embodiment of the present invention, the complementary thin film transistor further includes an etched barrier layer formed on the n-type semiconductor layer and the insulation layer.

In one embodiment of the present invention, the first electrode metal layer of the complementary thin film transistor is formed on the insulation layer and the n-type semiconductor layer.

In one embodiment of the present invention, the complementary thin film transistor further includes a second passivation layer and a second gate layer, the second passivation layer is formed on the second electrode metal layer, the first passivation layer and the p-type semiconductor layer, and the second gate layer is formed on the second passivation layer.

In one embodiment of the present invention, the metal oxide material of the n-type semiconductor layer is selected from an indium gallium zinc oxide, an indium zinc oxide, or a zinc tin oxide.

In one embodiment of the present invention, the organic semiconductor material of the p-type semiconductor layer is selected from pentacene, triphenylamine, fullerene, phthalocyanine, perylene derivative, or cyanine.

To achieve the above object, the present invention provides a manufacturing method of a complementary thin film transistor, the method comprises steps of: a first gate layer formation step for disposing a first gate layer on a substrate; an insulation layer formation step for forming an insulation layer on the first gate layer and the substrate; an n-type semiconductor layer formation step for forming an n-type semiconductor layer on the insulation layer, wherein the n-type semiconductor layer comprises a metal oxide material; a first electrode metal layer formation step for forming a first electrode metal layer on the n-type transistor region and the insulation layer; a first passivation layer formation step for a first passivation layer on the n-type semiconductor layer, the first passivation layer and the insulation layer, and forming at least one contacting hole; a second electrode metal layer formation step for forming a second electrode metal layer on the first passivation layer, wherein the first electrode metal layer and the second electrode metal layer are electrically connected with each other through the contacting hole; and a p-type semiconductor layer formation step forming a p-type semiconductor layer on the first passivation layer and the second electrode metal layer, wherein the p-type semiconductor layer comprises an organic semiconductor material.

In one embodiment of the present invention, after the n-type semiconductor layer formation step, the manufacturing method further comprises an etched barrier layer formation step for forming an etched barrier layer on the n-type semiconductor layer and the insulation layer.

In one embodiment of the present invention, after the p-type semiconductor layer formation step, the manufacturing method further comprises a second gate layer formation step for forming a second passivation layer on the second electrode metal layer, a first passivation layer and the a p-type semiconductor layer, and forming a second gate layer on the second passivation layer.

As described above, the n-type semiconductor layer and the p-type semiconductor layer are disposed above the substrate, so that an organic TFT can be made to be the area structure of the p-type thin film transistor by disposing p-type organic semiconductor material to the p-type semiconductor layer, and an oxide TFT can be made to be the area structure of the n-type thin film transistor by disposing n-type oxide material to the n-type semiconductor layer for simplifying the process and improving the device characteristics.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, and etc., are only directions by referring to the accompanying drawings, and thus the used directional terms are used to describe and understand the present invention, but the present invention is not limited thereto.

Figure 1:
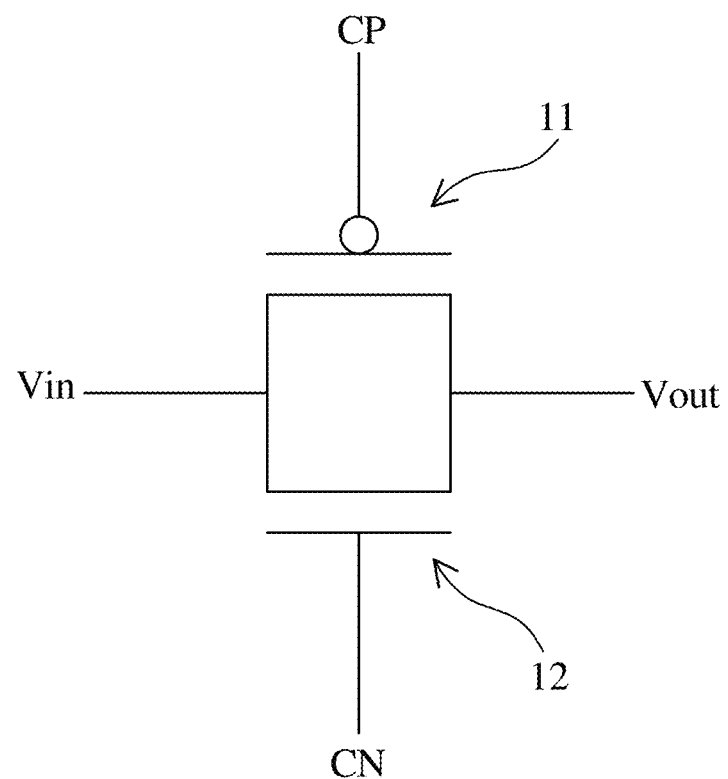
FIG. 1 is a schematic circuit diagram of a traditional transmission gate of a Continuous Time Fourier Transform.
Figure 2:
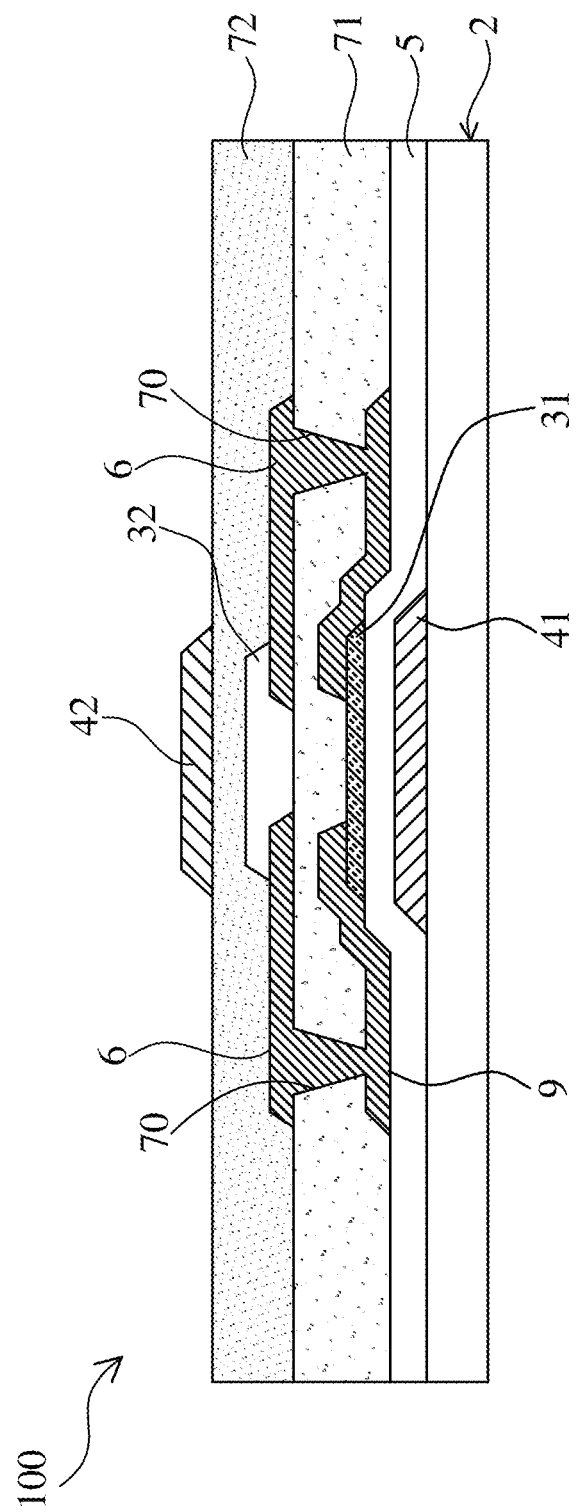
FIG. 2 is a cross-sectional view of a complementary thin film transistor according to a first preferred embodiment of the present invention.

Refer to FIG. 2, which is a cross-sectional view of a complementary thin film transistor 100 according to a first preferred embodiment of the present invention, wherein the complementary thin film transistor 100 has a substrate 2, an n-type semiconductor layer 31, a p-type semiconductor layer 32, a first gate layer 41, a insulation layer 5, a first electrode metal layer 9, a second electrode metal layer 6, a first passivation layer 71, a second passivation layer 72, and a second gate layer 42. The detailed structure of each component, assembly relationships, and principle of operation in the present invention will be described in detail hereinafter.

Refer to FIG. 2, the n-type semiconductor layer 31 is disposed above the substrate 2, wherein the n-type semiconductor layer 31 comprises a metal oxide material, and the metal oxide material of the n-type semiconductor layer 31 is selected from an indium gallium zinc oxide, an indium zinc oxide, or a zinc tin oxide in the first preferred embodiment.

Refer still to FIG. 2, the p-type semiconductor layer 32 is disposed above the substrate 2, wherein the p-type semiconductor layer 32 comprises an organic semiconductor material, and the organic semiconductor material of the p-type semiconductor layer 32 is selected from pentacene, triphenylamine, fullerene, phthalocyanine, perylene derivative, or cyanine in the first preferred embodiment.

Refer still to FIG. 2, the first gate layer 41 is formed on the substrate 2, and disposed below the n-type semiconductor layer 31. The first gate layer 41 is a metal material, such as aluminum, manganese, copper, titanium or alloy thereof in the first preferred embodiment.

Refer still to FIG. 2, the insulation layer 5 is formed on the first gate layer 41 and the substrate 2, wherein the n-type semiconductor layer 31 is formed on the insulation layer 5, and the insulation layer 5 is formed for insulating from the first gate layer 41 in the first preferred embodiment.

Refer still to FIG. 2, the first passivation layer 71 is disposed between the n-type semiconductor layer 31 and the p-type semiconductor layer 32, and the first passivation layer 71 is formed with at least one contacting hole 70 (two holes shown in FIG. 2).

Refer still to FIG. 2, the first passivation layer 71 is formed on the n-type semiconductor layer 31, the first electrode metal layer 9 is formed on the insulation layer 5 and the n-type semiconductor layer 31, the second electrode metal layer 6 is formed on the first passivation layer 71, and the first electrode metal layer 9 and the second electrode metal layer 6 are electrically connected with each other through the contacting hole 70.

Refer still to FIG. 2, the second passivation layer 72 is formed on the second electrode metal layer 6, the first passivation layer 71 and the p-type semiconductor layer 32 for insulating from the second gate layer 42. The second gate layer 42 is formed on the second passivation layer 72, and the second gate layer 42 corresponds with the p-type semiconductor layer 32, the n-type semiconductor layer 31, and the first gate layer 41.

As described above, the n-type semiconductor layer 31 and the p-type semiconductor layer 32 are disposed above the substrate 2, so that an organic TFT can be made to be the area structure of the p-type thin film transistor by disposing p-type organic semiconductor material to the p-type semiconductor layer 32, and an oxide TFT can be made to be the area structure of the n-type thin film transistor by disposing n-type oxide material to the n-type semiconductor layer 31 for simplifying the process and improving the device characteristics, such as increasing a on-state current (Ion), reducing off-state current (Ioff), and improving the shift of voltage Vth without additional cost.

Figure 3:
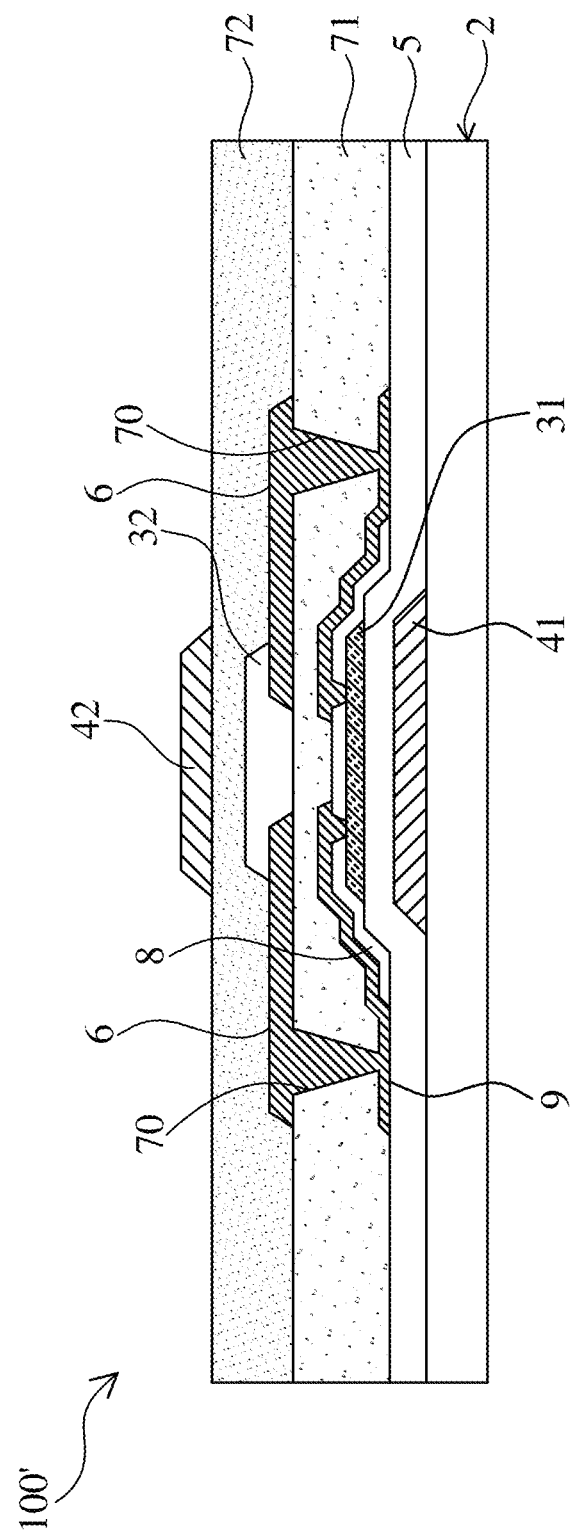
FIG. 3 is a cross-sectional view of a complementary thin film transistor according to a second preferred embodiment of the present invention.

Refer to FIG. 3, which is a cross-sectional view of a complementary thin film transistor 100' according to a second preferred embodiment of the present invention, and is similar to the first preferred embodiment, wherein the complementary thin film transistor 100' has a substrate 2, an n-type semiconductor layer 31, a p-type semiconductor layer 32, a first gate layer 41, a insulation layer 5, a first electrode metal layer 9, a second electrode metal layer 6, a first passivation layer 71, a second passivation layer 72, and a second gate layer 42. As shown, the difference of the second preferred embodiment is that the complementary thin film transistor 100' further includes an etched barrier layer 8 formed on the n-type semiconductor layer 31 and the insulation layer 5 to protect the n-type semiconductor layer 31 which is an n-type channel. Furthermore, the first electrode metal layer 9 is formed on the insulation layer 5 and n-type semiconductor layer 31, the second electrode metal layer 6 is formed on the first passivation layer 71, and the first electrode metal layer 9 and the second electrode metal layer 6 are electrically connected with each other through the contacting hole 70.

As described above, the etched barrier layer 8 is formed on the n-type semiconductor layer 31 the insulation layer 5 to protect the n-type semiconductor layer 31, which is an n-type channel.

Figure 4:
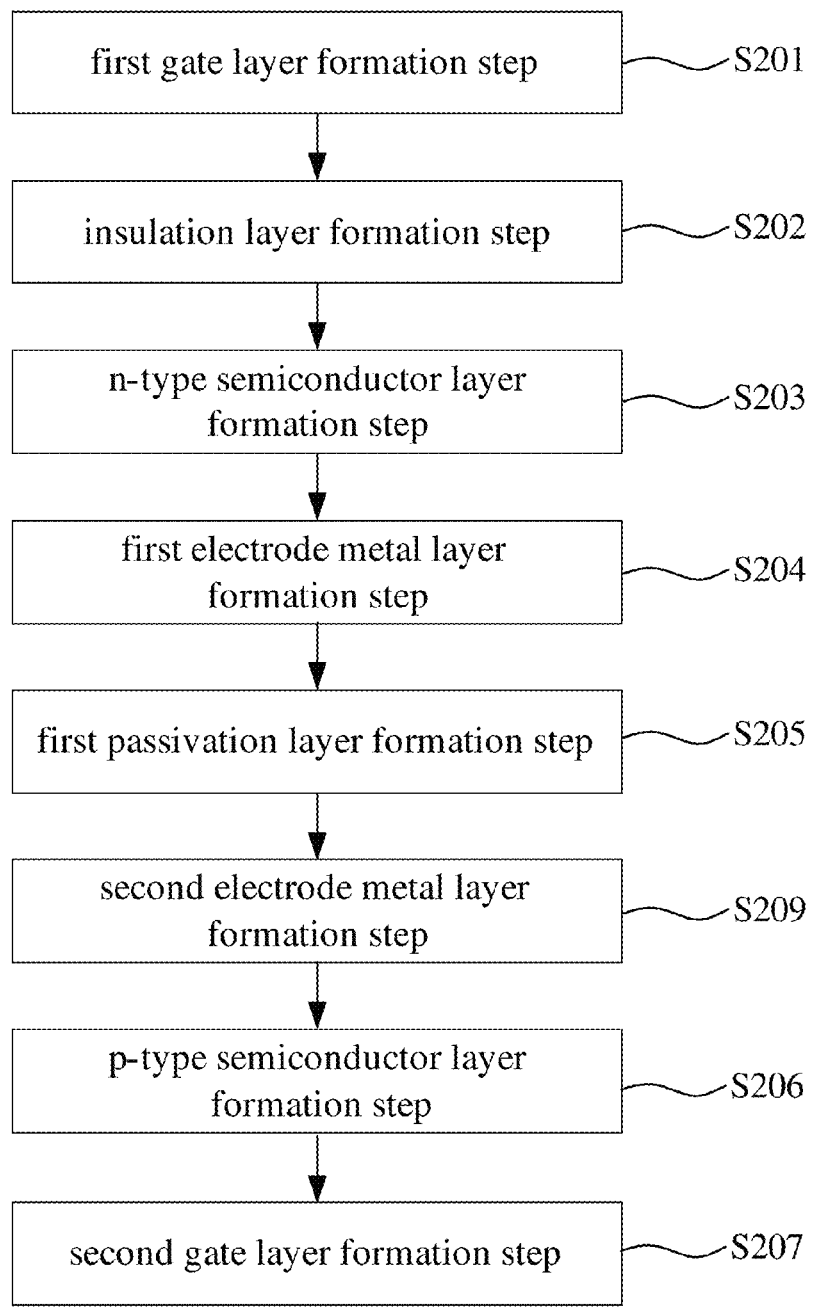
FIG. 4 is a flowchart of a manufacturing method of a complementary thin film transistor according to a first preferred embodiment of the present invention.

Refer to FIG. 4 with reference FIG. 2, which is a flowchart of a manufacturing method of a complementary thin film transistor according to a first preferred embodiment of the present invention. As shown, the measuring method comprises a first gate layer formation step S201, an insulation layer formation step S202, an n-type semiconductor layer formation step S203, a first electrode metal layer formation step S204, a first passivation layer formation step S205, a second electrode metal layer formation step S209, a p-type semiconductor layer formation step S206, and a second gate layer formation step S207.

Refer still to FIG. 4 with reference FIG. 2, in the first gate layer formation step S201, a first gate layer 41 is formed on a substrate 2.

Refer still to FIG. 4 with reference FIG. 2, in the insulation layer formation step S202, an insulation layer 5 is formed on the first gate layer 41 and the substrate 2.

Refer still to FIG. 4 with reference FIG. 2, in the n-type semiconductor layer formation step S203, an n-type semiconductor layer 31 is formed on the insulation layer 5, wherein the n-type semiconductor layer 31 comprises a metal oxide material.

Refer still to FIG. 4 with reference FIG. 2, in the first electrode metal layer formation step S204, a first electrode metal layer 9 is formed on the n-type semiconductor layer 31 and the insulation layer 5.

Refer still to FIG. 4 with reference FIG. 2, in the first passivation layer formation step S205, a first passivation layer 71 is formed on the n-type semiconductor layer 31, the first electrode metal layer 9 and the insulation layer 5, and disposed at least one contacting hole 70.

Refer still to FIG. 4 with reference FIG. 2, in the second electrode metal layer formation step S209, a second electrode metal layer 6 is formed on the first passivation layer 71, and the first electrode metal layer 9 and the second electrode metal layer 6 are electrically connected with each other through the contacting hole 70.

Refer still to FIG. 4 with reference FIG. 2, in the p-type semiconductor layer formation step S206, a p-type semiconductor layer 32 is formed on the first passivation layer 71 and the second electrode metal layer 6, wherein the p-type semiconductor layer 32 comprises an organic semiconductor material.

Refer still to FIG. 4 with reference FIG. 2, in the second gate layer formation step S207, a second passivation layer 72 is formed on the second electrode metal layer 6, the first passivation layer 71, and the p-type semiconductor layer 32, and a second gate layer 42 is formed on the second passivation layer 72.

As described above, the n-type semiconductor layer 31 and the p-type semiconductor layer 32 are disposed above the substrate 2, so that an organic TFT can be made to be the area structure of the p-type thin film transistor by disposing p-type organic semiconductor material to the p-type semiconductor layer 32, and an oxide TFT can be made to be the area structure of the n-type thin film transistor by disposing n-type oxide material on the n-type semiconductor layer 31 for simplifying the process and improving the device characteristics, such as increasing a on-state current (Ion), reducing off-state current (Ioff), and improving the shift of voltage Vth without additional cost.

Figure 5:
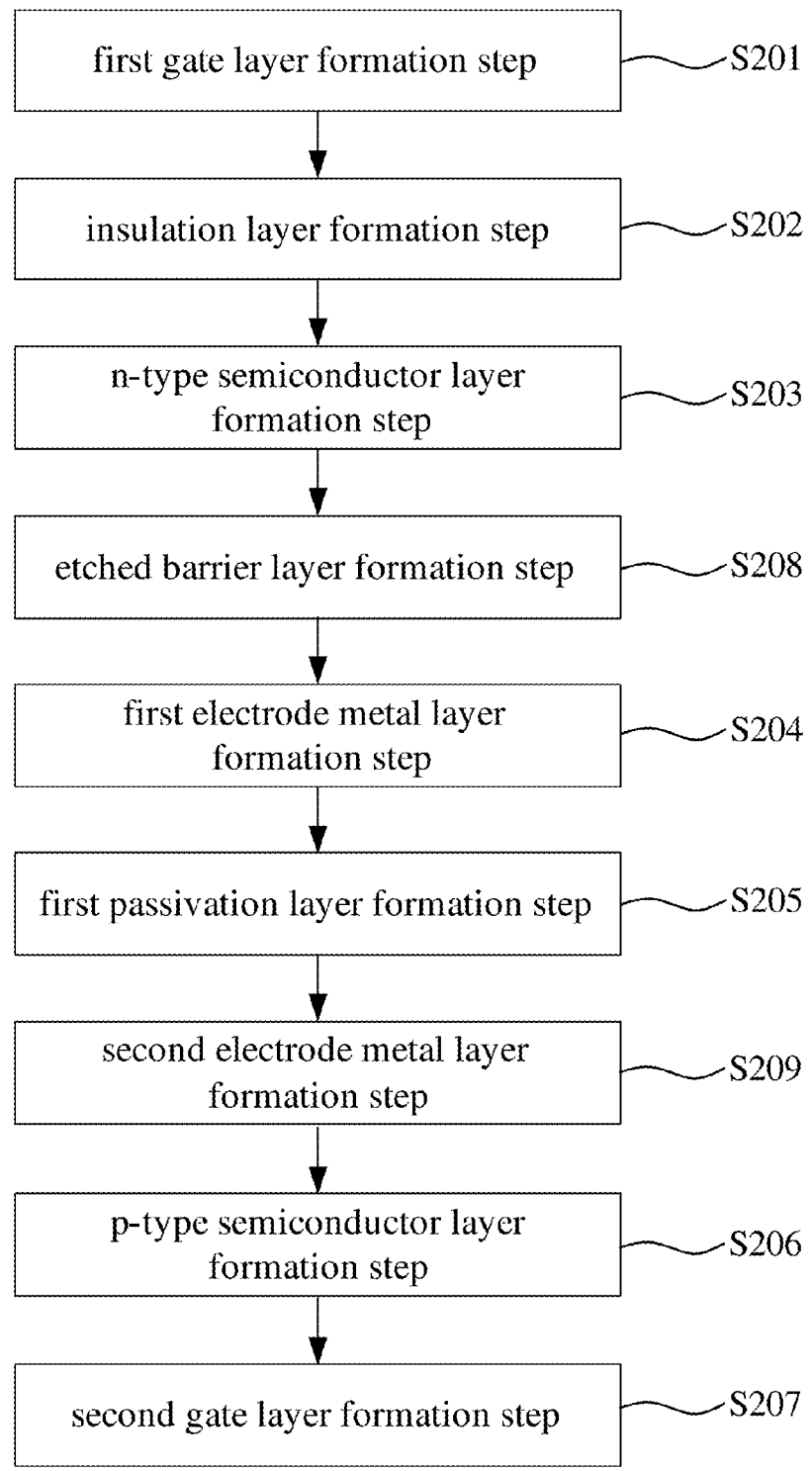
FIG. 5 is a flowchart of a manufacturing method of a complementary thin film transistor according to a second preferred embodiment of the present invention.

Refer to FIG. 5 with reference FIG. 3, which is a flowchart of a manufacturing method of a complementary thin film transistor according to a second preferred embodiment of the present invention. As shown, the measuring method comprises a first gate layer formation step S201, an insulation layer formation step S202, an n-type semiconductor layer formation step S203, an etched barrier layer formation step S208, a first electrode metal layer formation step S204, a first passivation layer formation step S205, a second electrode metal layer formation step S209, a p-type semiconductor layer formation step S206, and a second gate layer formation step S207.

Refer still to FIG. 5 with reference FIG. 3, in the first gate layer formation step S201, a first gate layer 41 is formed on a substrate 2.

Refer still to FIG. 5 with reference FIG. 3, in the insulation layer formation step S202, an insulation layer 5 is formed on the first gate layer 41 and the substrate 2.

Refer still to FIG. 5 with reference FIG. 3, in the n-type semiconductor layer formation step S203, an n-type semiconductor layer 31 is formed on the insulation layer 5, wherein the n-type semiconductor layer 31 comprises a metal oxide material.

Refer still to FIG. 5 with reference FIG. 3, in etched barrier layer formation step S208, an etched barrier layer 8 is formed on the n-type semiconductor layer 31 and the insulation layer 5.

Refer still to FIG. 5 with reference FIG. 3, in the first electrode metal layer formation step S204, a first electrode metal layer 9 is formed on the etched barrier layer 8, the n-type semiconductor layer 31 and the insulation layer 5.

Refer still to FIG. 5 with reference FIG. 3, in the first passivation layer formation step S205, a first passivation layer 71 is formed on the n-type semiconductor layer 31, the first electrode metal layer 9 and the insulation layer 5, and disposed at least one contacting hole 70.

Refer still to FIG. 5 with reference FIG. 3, in the second electrode metal layer formation step S209, a second electrode metal layer 6 is formed on the first passivation layer 71, and the first electrode metal layer 9 and the second electrode metal layer 6 are electrically connected with each other through the contacting hole 70.

Refer still to FIG. 5 with reference FIG. 3, in the p-type semiconductor layer formation step S206, a p-type semiconductor layer 32 is formed on the first passivation layer 71 and the second electrode metal layer 6, wherein the p-type semiconductor layer 32 comprises an organic semiconductor material.

Refer still to FIG. 5 with reference FIG. 3, in the second gate layer formation step S207, a second passivation layer 72 is formed on the second electrode metal layer 6, the first passivation layer 71, and the p-type semiconductor layer 32, and a second gate layer 42 is formed on the second passivation layer 72.

As described above, the etched barrier layer 8 is formed on the n-type semiconductor layer 31 the insulation layer 5 to protect the n-type semiconductor layer 31 which is an n-type channel.

The present invention has been described with preferred embodiments thereof and it is understood that many changes and modifications to the described embodiments can be carried out without departing from the scope and the spirit of the invention that is intended to be limited only by the appended claims.

What is claimed is:

1. A complementary thin film transistor, comprising:
   a substrate;
   an n-type semiconductor layer disposed above the substrate, wherein the n-type semiconductor layer comprises a metal oxide material, and the metal oxide material of the n-type semiconductor layer is selected from an indium gallium zinc oxide, an indium zinc oxide, or a zinc tin oxide;
   a p-type semiconductor layer disposed above the substrate, wherein the p-type semiconductor layer comprises an organic semiconductor material, and the organic semiconductor material of the p-type semiconductor layer is selected from pentacene, triphenylamine, fullerene, phthalocyanine, perylene derivative, or cyanine;
   a first passivation layer disposed between the n-type semiconductor layer and the p-type semiconductor layer, and formed with at least one contacting hole;
   a first electrode metal layer formed on the n-type semiconductor layer; and
   a second electrode metal layer formed on the first passivation layer, wherein the first electrode metal layer and the second electrode metal layer are electrically connected with each other through the contacting hole.

2. The complementary thin film transistor according to claim 1, wherein the complementary thin film transistor further includes a first gate layer and an insulation layer, the first gate layer is formed on the substrate, and the insulation layer is formed on the first gate layer and the substrate, wherein the n-type semiconductor layer is formed on the insulation layer.

3. The complementary thin film transistor according to claim 2, wherein the first electrode metal layer is formed on the insulation layer and the n-type semiconductor layer.

4. The complementary thin film transistor according to claim 2, wherein the complementary thin film transistor further includes a second passivation layer and a second gate layer, the second passivation layer is formed on the second electrode metal layer, the first passivation layer and the p-type semiconductor layer, and the second gate layer is formed on the second passivation layer.

5. The complementary thin film transistor according to claim 2, wherein the complementary thin film transistor further includes an etched barrier layer formed on the n-type semiconductor layer and the insulation layer.

6. The complementary thin film transistor according to claim 5, wherein the first electrode metal layer of the complementary thin film transistor is formed on the insulation layer and the n-type semiconductor layer.

7. The complementary thin film transistor according to claim 5, wherein the complementary thin film transistor further includes a second passivation layer and a second gate layer, the second passivation layer is formed on the second electrode metal layer, the first passivation layer and the p-type semiconductor layer, and the second gate layer is formed on the second passivation layer.

8. A complementary thin film transistor, comprising:
   a substrate;
   an n-type semiconductor layer disposed above the substrate, wherein the n-type semiconductor layer comprises a metal oxide material;
   a p-type semiconductor layer disposed above the substrate, wherein the p-type semiconductor layer comprises an organic semiconductor material;
   a first passivation layer disposed between the n-type semiconductor layer and the p-type semiconductor layer, and formed with at least one contacting hole;
   a first electrode metal layer formed on the n-type semiconductor layer; and
   a second electrode metal layer formed on the first passivation layer, wherein the first electrode metal layer and the second electrode metal layer are electrically connected with each other through the contacting hole.

9. The complementary thin film transistor according to claim 8, wherein the complementary thin film transistor further includes a first gate layer and an insulation layer, the first gate layer is formed on the substrate, and the insulation layer is formed on the first gate layer and the substrate, wherein the n-type semiconductor layer is formed on the insulation layer.

10. The complementary thin film transistor according to claim 9, wherein the first electrode metal layer is formed on the insulation layer and the n-type semiconductor layer.

11. The complementary thin film transistor according to claim 9, wherein the complementary thin film transistor further includes a second passivation layer and a second gate layer, the second passivation layer is formed on the second electrode metal layer, the first passivation layer and the p-type semiconductor layer, and the second gate layer is formed on the second passivation layer.

12. The complementary thin film transistor according to claim 9, wherein the complementary thin film transistor further includes an etched barrier layer formed on the n-type semiconductor layer and the insulation layer.

13. The complementary thin film transistor according to claim 12, wherein the first electrode metal layer of the complementary thin film transistor is formed on the insulation layer and the n-type semiconductor layer.

14. The complementary thin film transistor according to claim 12, wherein the complementary thin film transistor further includes a second passivation layer and a second gate layer, the second passivation layer is formed on the second electrode metal layer, the first passivation layer and the p-type semiconductor layer, and the second gate layer is formed on the second passivation layer.

15. The complementary thin film transistor according to claim 8, wherein the metal oxide material of the n-type semiconductor layer is selected from an indium gallium zinc oxide, an indium zinc oxide, or a zinc tin oxide.

16. The complementary thin film transistor according to claim 8, wherein the organic semiconductor material of the p-type semiconductor layer is selected from pentacene, triphenylamine, fullerene, phthalocyanine, perylene derivative, or cyanine.

17. A manufacturing method of a complementary thin film transistor, comprising steps of:
   a first gate layer formation step for disposing a first gate layer on a substrate;
   an insulation layer formation step for forming an insulation layer on the first gate layer and the substrate;
   an n-type semiconductor layer formation step for forming an n-type semiconductor layer on the insulation layer, wherein the n-type semiconductor layer comprises a metal oxide material;
   a first electrode metal layer formation step for forming a first electrode metal layer on the n-type transistor region and the insulation layer;
   a first passivation layer formation step for a first passivation layer on the n-type semiconductor layer, the first passivation layer and the insulation layer, and forming at least one contacting hole;

a second electrode metal layer formation step for forming a second electrode metal layer on the first passivation layer, wherein the first electrode metal layer and the second electrode metal layer are electrically connected with each other through the contacting hole; and a p-type semiconductor layer formation step forming a p-type semiconductor layer on the first passivation layer and the second electrode metal layer, wherein the p-type semiconductor layer comprises an organic semiconductor material.

18. The manufacturing method according to claim 17, wherein after the n-type semiconductor layer formation step, the manufacturing method further comprises an etched barrier layer formation step for forming an etched barrier layer on the n-type semiconductor layer and the insulation layer.

19. The manufacturing method according to claim 17, wherein after the p-type semiconductor layer formation step, the manufacturing method further comprises a second gate layer formation step for forming a second passivation layer on the second electrode metal layer, a first passivation layer and the a p-type semiconductor layer, and forming a second gate layer on the second passivation layer.

\* \* \* \* \*